(12) United States Patent
Lam et al.

(10) Patent No.: US 6,445,029 B1
(45) Date of Patent: Sep. 3, 2002

(54) NVRAM ARRAY DEVICE WITH ENHANCED WRITE AND ERASE

(75) Inventors: Chung H. Lam, Williston; Richard Q. Williams, Essex Junction, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/695,151

(22) Filed: Oct. 24, 2000

(51) Int. Cl.[7] .................................................. H01L 29/76
(52) U.S. Cl. ........................ 257/314; 257/316; 257/321; 257/322; 438/259; 438/267; 438/589
(58) Field of Search ................................. 257/314, 316, 257/321, 322; 365/185.15, 185.31, 63, 72; 438/259, 267, 589

(56) References Cited

U.S. PATENT DOCUMENTS

| | | |
|---|---|---|
| 4,234,887 A | 11/1980 | Vanderslice, Jr. |
| 4,458,407 A | 7/1984 | Hoeg, Jr. et al. |
| 4,471,471 A | 9/1984 | DiMaria |
| 4,630,086 A | 12/1986 | Sato et al. |
| 4,939,559 A | 7/1990 | DiMaria et al. |
| 5,051,956 A | 9/1991 | Burns |
| 5,544,103 A * | 8/1996 | Lambertson ........... 365/185.15 |
| 5,617,351 A | 4/1997 | Bertin et al. |
| 5,656,544 A | 8/1997 | Bergendahl et al. |
| 5,780,341 A | 7/1998 | Ogura |
| 5,835,409 A * | 11/1998 | Lambertson ........... 365/185.15 |
| 5,874,337 A * | 2/1999 | Geissler ..................... 438/259 |

* cited by examiner

Primary Examiner—Richard Elms
Assistant Examiner—Douglas Menz
(74) Attorney, Agent, or Firm—Whitham, Curtis & Christofferson, P.C.; Richard M. Kotulak

(57) ABSTRACT

Increased write and erase tunnelling currents are developed by enhancement of an electric field near a floating gate with a shaped edge structure overlapping a source/drain diffusion and developing increased floating gate area with angled regions joined by edges in order to reduce write and erase cycle times. The edge structure is formed by selective and preferential etching in accordance with the crystal structure of a monocrystalline semiconductor substrate. The sharpness of the edges and concentration of the electric field may be enhanced by consumption and stress effects of oxidation of the substrate to form a floating gate insulator.

7 Claims, 7 Drawing Sheets

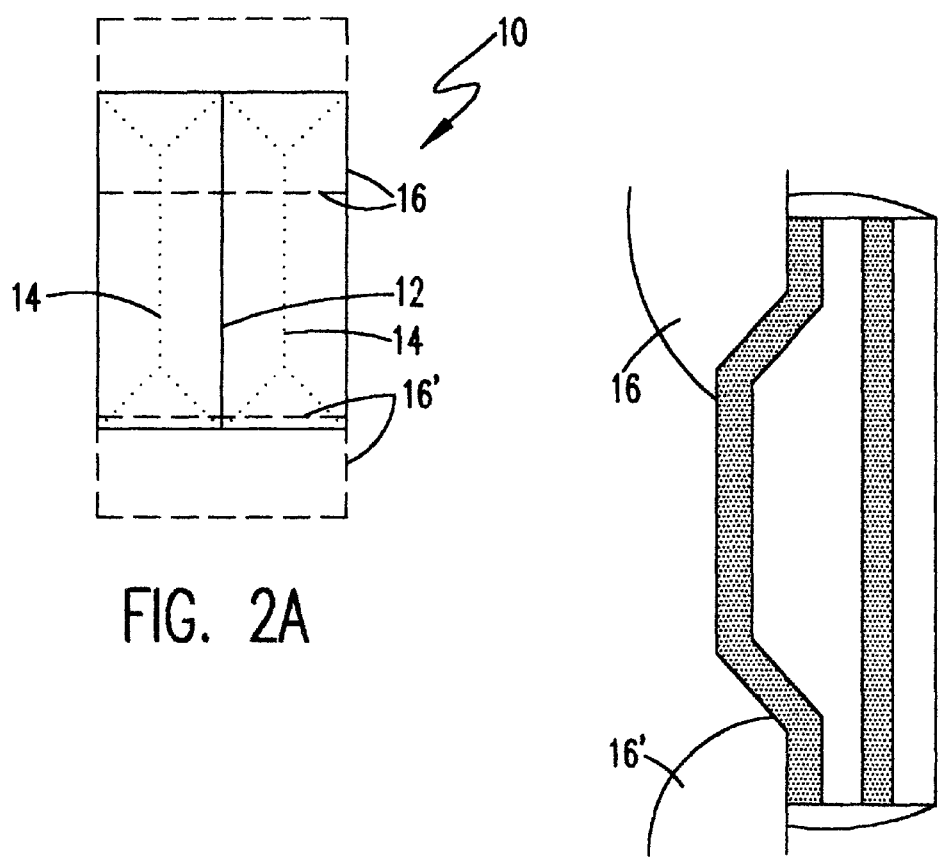
FIG. 2A
FIG. 2C
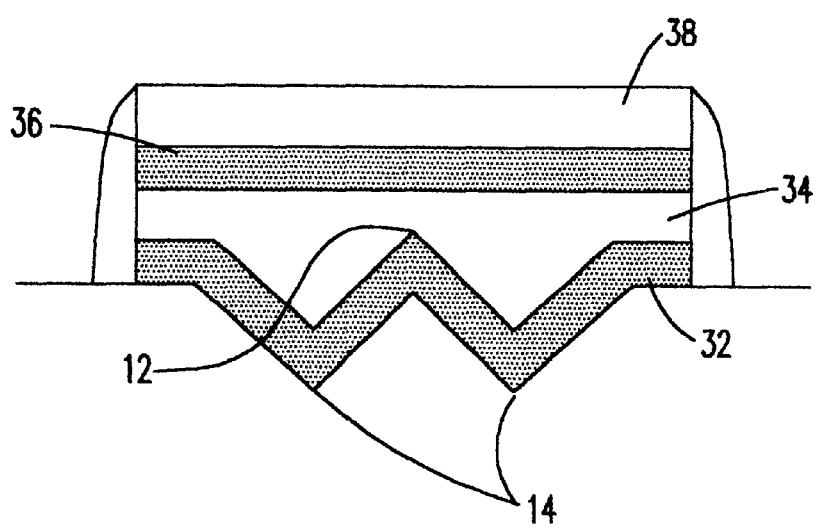
FIG. 2B

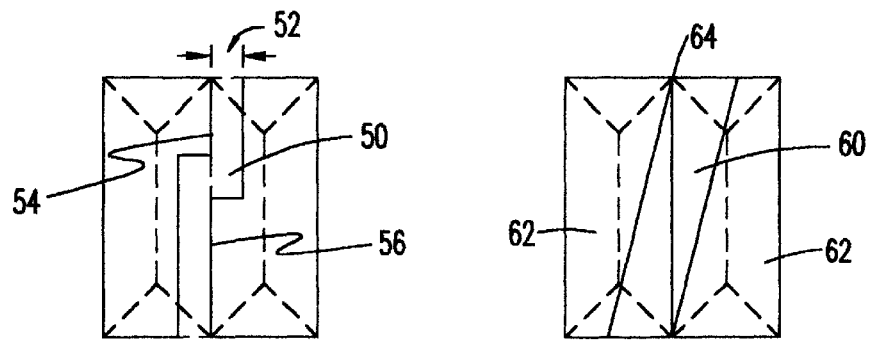
FIG. 5
FIG. 6
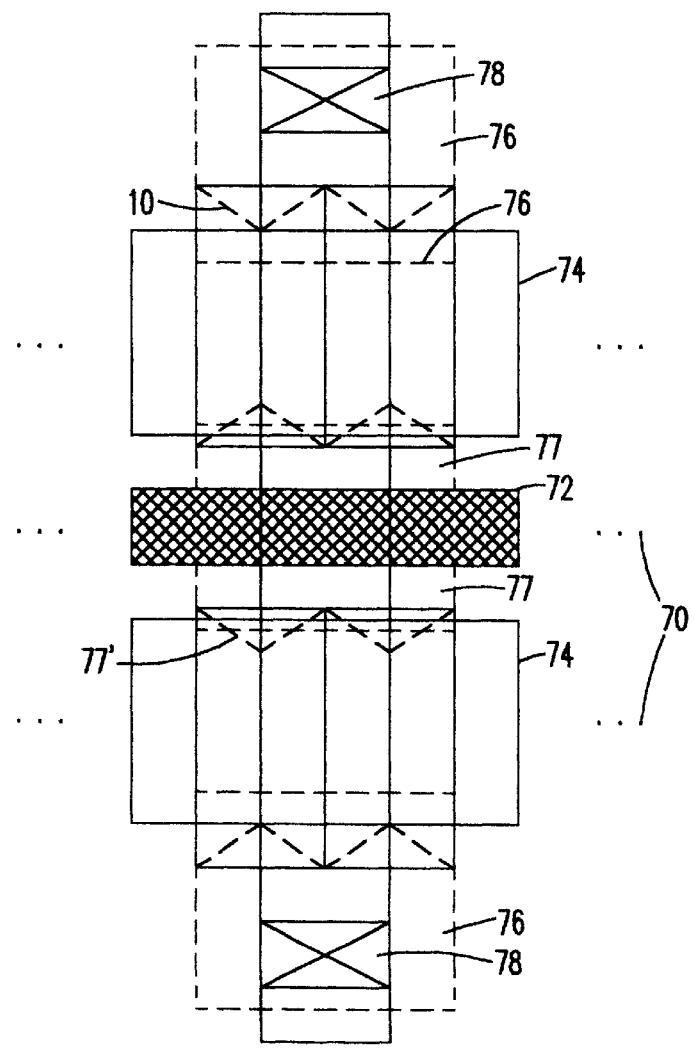
FIG. 7

NVRAM ARRAY DEVICE WITH ENHANCED WRITE AND ERASE

BACKGROUND OF THE INVENTION

1. Field of the Invention

The present invention generally relates to non-volatile random access memory (NVRAM) arrays and, more particularly, to arrays of memory cells formed as a field effect transistor having a floating gate on which charge can be placed by tunnelling effects.

2. Description of the Prior Art

Digital signal processing arrangements such as microprocessors use many different types of memory and storage structures for different purposes. The type of memory used will often be determined by the needed speed of access, the length of time data will be stored and the operational circumstances during storage of data. For example, a read-only memory (ROM) is used for data which is necessary for operation of the processor and never changed while a random access memory (RAM) of either a static or dynamic type is used for the working memory of the processor and access speed may be enhanced by the use of one or more levels of caching. In general, random access memories can only store data when power is applied thereto.

Between these extremes, various storage structures are known for storage of data which may be changed at will but under circumstances where power is not or cannot be maintained at all times during data storage. Various magnetic media such as well-known hard disks are often used for such purposes. However, magnetic storage devices rely on relative movement between the storage medium and a reading device in order to write and erase data on the medium and the mechanical arrangement for doing so is subject to wear, damage or malfunctions and is a source of potential damage to the storage medium, as well. The mechanical arrangement also imposes a lower limit on size and weight of the storage device.

It is generally considered that semiconductor arrangements would provide increased reliability, reduced susceptibility to damage and potentially reduced size and weight to perform the non-volatile storage functions for which magnetic media are now generally used. Electrically erasable programmable read only memories (EEPROMs) are known which generally employ memory cells which are similar to a field effect transistor but include an additional insulated structure referred to as a floating gate on which charge can be selectively stored. The charge can be placed on or removed from the floating gate by several known tunnelling effects such as Fowler-Nordheim tunnelling or channel hot electron tunnelling. When a potential is placed on an electrode known as a control gate located over the floating gate, the channel of the transistor will become conductive or not depending on the total electric field contributions of the control gate and the charge, if any, on the floating gate.

In order to create a viable semiconductor alternative to magnetic media, significant development has been required in three principal areas of performance: memory cell capacity of a single chip, the number of write and erase cycles which can be reliably performed and the required cycle time for write and erase operations. In this regard, recent developments in cell layout and lithographic and semiconductor manufacturing process have allowed several millions of storage cells to be placed on a single chip of substantially standard dimensions and storage capacity of a single package has been further increased by multi-chip modular packaging. Similarly, while each write and erase cycle causes slight but cumulative damage to the insulation surrounding the floating gate, improvements in insulator materials and operating techniques have provided sufficient numbers of write and erase cycles to assure reliable operation over a period of time well in excess of the period of obsolescence of processors in many applications.

However, since tunnelling currents are very small, the write and erase cycle times have remained relatively intractable, consistent with reliability and small cell size. Reduced thickness of floating gate insulation can reduce the needed amount of stored charge but increases susceptibility to damage by tunnelling currents and increasing leakage with use as well as possibly compromising manufacturing yield. For a given thickness of floating gate insulator, reduced stored charge corresponds to reduced operating margins and increased possibility of read errors. Likewise, increase of tunnelling current by operation at increased write and erase voltages also increases the likelihood of insulator damage.

In general, the necessary amount of stored charge and available tunnelling current are such that write and erase times are several orders of magnitude longer than those of static or dynamic RAMs and erase cycle times may be in the millisecond range. Such cycle times certainly do not compare favorably with the bandwidth of current magnetic media. No significant reduction in write and erase cycle times has been achieved that does not compromise cell size, operating margins, reliability and/or manufacturing yield.

SUMMARY OF THE INVENTION

It is therefore an object of the present invention to provide a non-volatile memory structure with reduced write and erase cycle times.

It is another object of the invention to provide increased write and erase tunnelling current in a non-volatile semiconductor memory device without compromising cell size, operating margins, reliability or manufacturing yield.

It is a further object of the invention to provide a non-volatile memory cell structure in which increased tunnelling current is achieved at a given write or erase voltage.

In order to accomplish these and other objects of the invention, a non-volatile memory cell and an integrated circuit such as a non-volatile memory array are provided in which the non-volatile memory cell includes a semiconductor substrate having an edge structure including oppositely directed edges formed in a gate area and providing enhancement of an electric field adjacent a floating gate which is insulated from the substrate, and a control gate located adjacent but insulated from the floating gate within said gate area.

In accordance with another aspect of the invention, a method of forming a non-volatile memory cell on a monocrystalline semiconductor substrate is provided including steps of applying an apertured mask to the substrate wherein the mask includes a mask element separating one aperture region from another aperture region, and preferentially etching the monocrystalline substrate in directions to form edges directed away from and toward a floating gate.

BRIEF DESCRIPTION OF THE DRAWINGS

The foregoing and other objects, aspects and advantages will be better understood from the following detailed description of a preferred embodiment of the invention with reference to the drawings, in which:

FIGS. 2A, 2B and 2C are plan and cross-sectional views of a memory cell structure in accordance with the invention, FIG. 7 is a preferred layout of a pair of memory cells in accordance with the invention.

DETAILED DESCRIPTION OF A PREFERRED EMBODIMENT OF THE INVENTION

Figure 1:
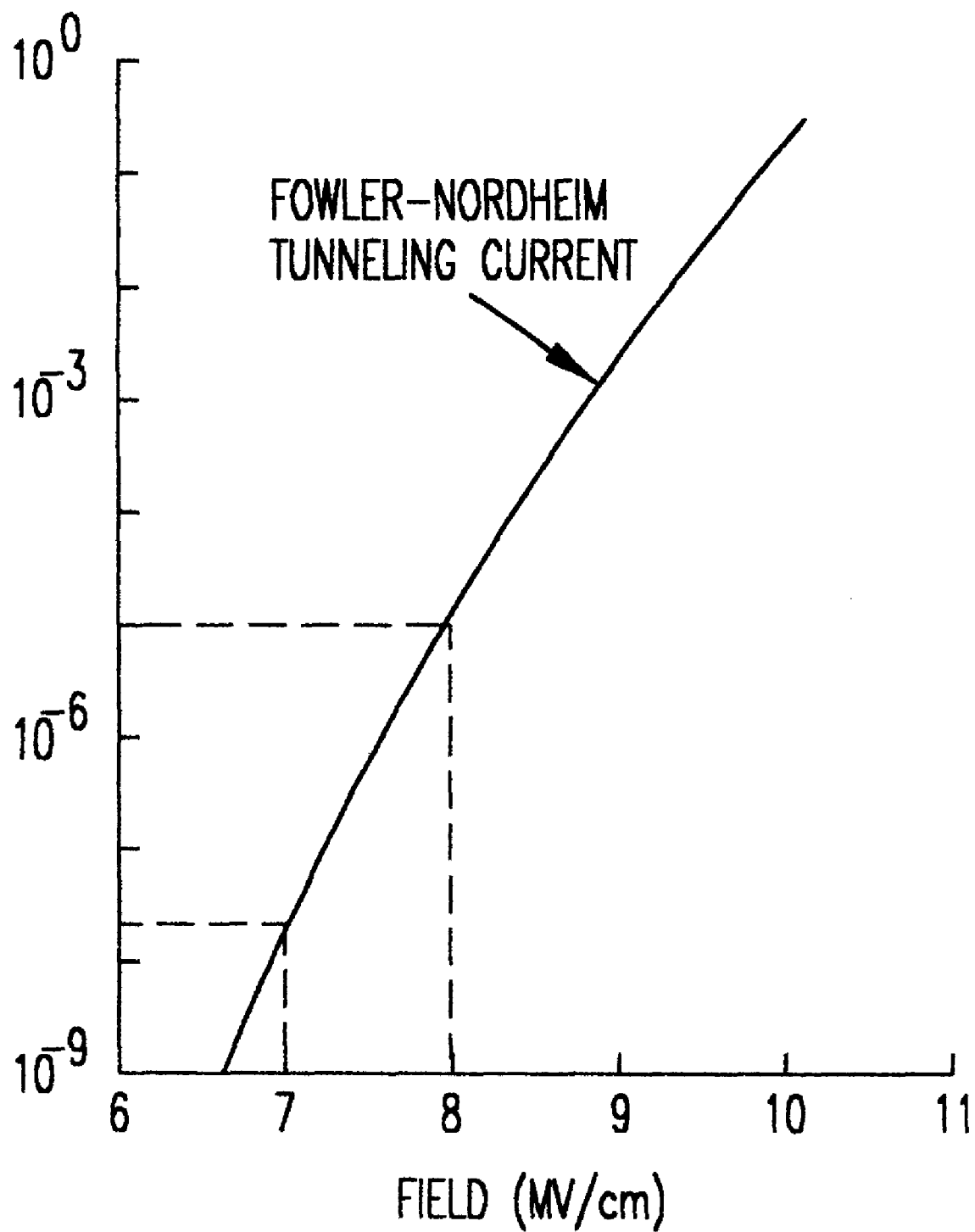
FIG. 1 is a graph showing variation in Fowler-Nordheim tunnelling current with electric field.

Referring now to the drawings, and more particularly to FIG. 1, there is shown a graph of Fowler-Nordheim current density as a function of electric field. This graph is published in "Flash Memory Cells—An Overview" by Paolo Pavan et al.; Proceedings of the IEEE Vol. 85, No. 8: August 1997: pp. 1248–1271. It is apparent from FIG. 1 that current density increases sharply and almost exponentially with increases in electrical field.

However, as alluded to above, increasing operating voltage sufficiently to obtain a significant increase in current density is not feasible since other important qualities of a non-volatile memory cell storing such tunnelling current would be severely compromised. Additionally, higher voltages requires higher voltage power supplies, more robust power conditioning circuitry and high power requirements while many NVRAM applications, such as smart cards, necessarily require low power operation and supporting circuits of very small size. Accordingly, a basic principle of the present invention provides an increased field by geometrical field crowding or concentration and increased area of the floating gate insulator at the interface with the memory cell transistor channel to obtain significantly increased floating gate charging/tunnelling current for a given voltage.

As can be seen from exemplary dashed lines in FIG. 1, a 15%–20% increase in the electric field (e.g. from seven to eight MV/cm) can yield more than several orders of magnitude increase in floating gate charging current. Accordingly, the desired amount of charge can be provided to or removed from the floating gate in an amount of time reduced by the same factor as the increase in tunnelling current.

Referring now to FIGS. 2A–2C, a preferred structure for developing geometric field crowding will be discussed. In accordance with the invention, field enhancement by geometric field crowding is provided by an edge structure 10 which concentrates the field in the direction of tunnelling current. The field enhancement provided by the invention is on the order of about 30% at the non-planar edges 12, 14 of the edge structure 10. While the field over the planar regions is similar to a standard NVRAM device with a similar tunnel oxide thickness, the area thereof is increased compared with the conventional device, allowing greater write or erase current for the same, tolerable level of floating gate insulator damage per cycle. Since the floating gate must be both charged and discharged, both an upward pointing edge 12 and two downward pointing edges 14 are provided over one or both of the transistor diffusions 16 to assist with write and erase operations, respectively.

It should be appreciated that erase operations generally are conducted on a block of storage cells simultaneously using an erase-read-verify methodology. For this reason, erase operations more fully stress power supplies and may require longer periods to fully reduce the charge on the floating gate to the desired level. Further, it may be necessary to perform the erase operation a plurality of times to assure that erased states of all memory cells of a block are achieved. In this regard, it should be appreciated that the preferred form of the edge structure 10 favors increased current for the erase operation by providing additional edge length; preferentially reducing erase cycle time and increasing erase operation reliability.

Further, since the tunnelling currents are established by the fields which are set by the edges, the constraints on the dimensions of overall floating gate oxide are reduced and the oxide can be made thicker (which the geometry at the edges tends to favor, as well) to reduce leakage, potential damage (particularly where the tunnelling current is most increased) and loss of manufacturing yield by increasing the process window. At the same time, the capacitance of the floating gate with respect to the control gate may be maintained at the same level which would be desirable in a conventional device since a planar top surface of the floating gate, as shown, for example, in FIG. 2B, may be achieved (e.g. by chemical-mechanical polishing) and such a process is unaffected by the development of the edge structure at the bottom of the floating gate. By the same token, capacitance of the floating gate with respect to the control gate can be controlled to any desired value by a combination of undulation of the upper surface of the floating gate 34, undulation of the bottom surface of the control gate 38 and/or insulator material/dielectric constant and thickness, as shown, for example, in FIGS. 3E–3G.

The edge structure also does not compromise minimum memory cell size, as will now be discussed in connection with FIGS. 3A–3G. The cross-section of the substrate 20 shown in FIG. 3A assumes well implants and isolation structures such as shallow trench isolation (STI) structures necessary to the overall device have already been formed and only the formation of a single memory cell will be discussed in connection with these Figures. It is also assumed that the crystal orientation at the surface of the substrate 20 is <100> (or another orientation which can be preferentially etched).

A layer of oxide 22 and nitride 24 are deposited and lithographically patterned to define the gate area 26. The gate area may be of the minimum feature size resolvable by the lithographic tool employed for the purpose. In this regard, to develop the edge structure in accordance with the invention, two rectangular areas must be defined in extremely close proximity to each other. Therefore, the necessary separation may be less than the minimum resolvable feature size. The processing techniques described below are directed to preferred techniques such that neither the separation of the rectangular areas nor the dimensions of the rectangular areas themselves require the memory cell to be larger than the minimum feature size.

Figure 3A:
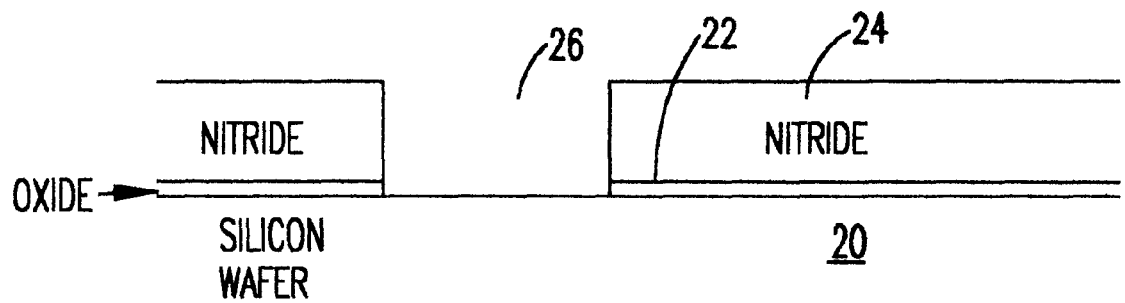
FIGS. 3A, 3B, 3C, 3E, 3F and 3G are plan and cross-sectional views illustrating the fabrication of the memory cell of FIGS. 2A–2C, FIGS. 4A, 4B, 4C, 4D, 4E and 4F are plan and cross-sectional views illustrating the simultaneous fabrication of two memory cells of FIGS. 2A–2C, FIGS. 5 and 6 are plan views of alternative mask patterns usable in the manufacture of the invention.
Figure 3B:
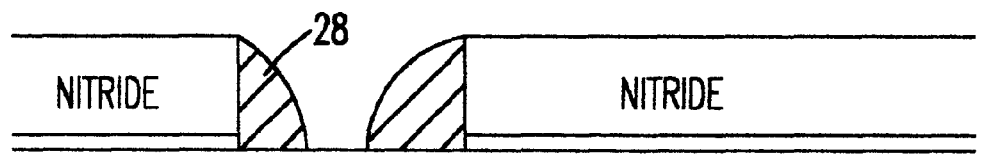
Figure 3C:
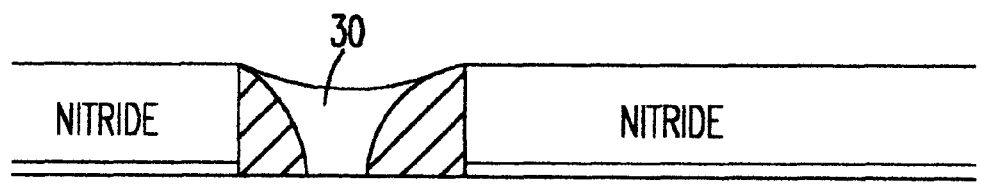

As shown in FIG. 3B, sacrificial polysilicon sidewalls 28 are formed on the edges of the gate area opening 26 by an isotropic deposition followed by an anisotropic etch. Thickness of the deposition and the sidewalls is not particularly critical as long as a void is created between the sidewalls. Therefore, the polysilicon deposit should be slightly less than half the transverse dimensions of the gate area opening. Then, as shown in FIG. 3C, a sacrificial oxide 30 or other material that can be selectively etched to polysilicon is deposited to about one-half the thickness of oxide and nitride layers 22, 24. This thickness is also not particularly critical to the practice of the invention but should be less than the full depth of the sidewall spacers 28 since the spacers are tapered and increased thickness of deposit 30 will impede or possibly prevent the subsequent etch process by fully covering the tapered spacers 28. Conversely, the sacrificial oxide can be too thin to effectively provide a mask for a sufficient selective etch.

The basic shape of the edge structure is now formed by selective etching of the polysilicon spacers 28 and the underlying monocrystalline silicon 20 which is also preferential to the crystal orientation of the silicon. Potassium Hydroxide is suitable for this purpose and preferentially removes silicon in the <100> direction much faster than in the <111> direction The relative etch rate in the <100> and <111> directions can be selected by adjusting the dilution (e.g. up to about 200:1 in 44% KOH by weight) and is chosen to give abrupt edges. (The etch rate is also affected by temperature and other process factors) It should be noted that some undercut of silicon at the sacrificial oxide 30 occurs and is desirable to develop the sharp edges desired for crowding the electric field.

Figure 3E:
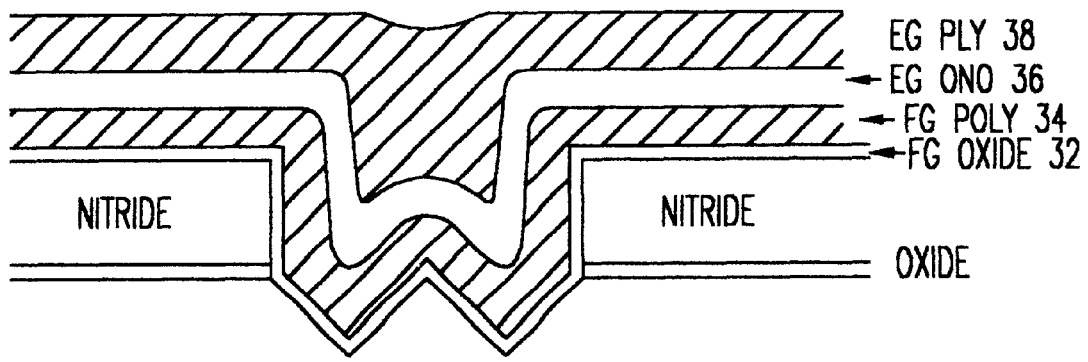
Figure 3F:
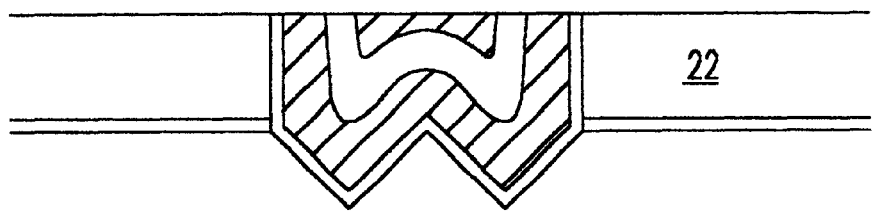
Figure 3G:
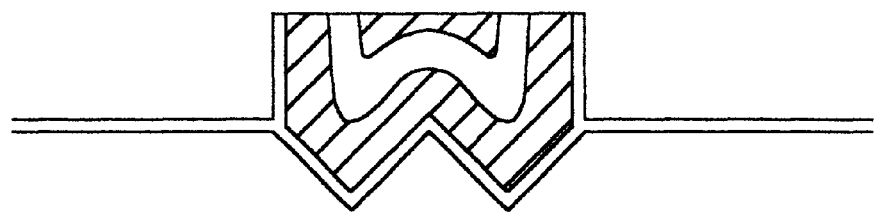

Then, as shown in FIG. 3E, the gate stack of the memory cell is formed by growing an oxide layer 32, depositing a floating gate polysilicon film 34, depositing a control gate dielectric (preferably a multilayer structure of oxide and nitride such as ONO) 36 and a control gate polysilicon film 38. It should be noted in this regard that the growth (or heat treatment after deposition) of the floating gate oxide 32 can further sharpen the edges of the edge structure 10 through stress and silicon consumption effects from oxidation. This structure can then be planarized to nitride 24 to separate the memory cells as shown in FIG. 3F and the nitride layer 24 removed, as shown in FIG. 3G. The device is then completed by forming source/drain implants and diffusions 16, 16' (in front of and behind the plane of the page) and connections thereto, as will be discussed in greater detail in connection with FIG. 7.

Figure 4A:
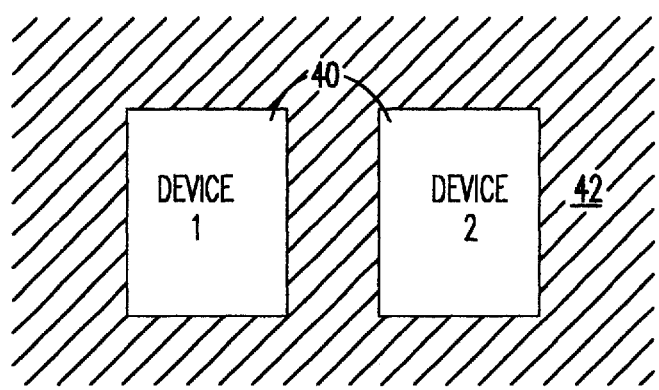
Figure 4B:
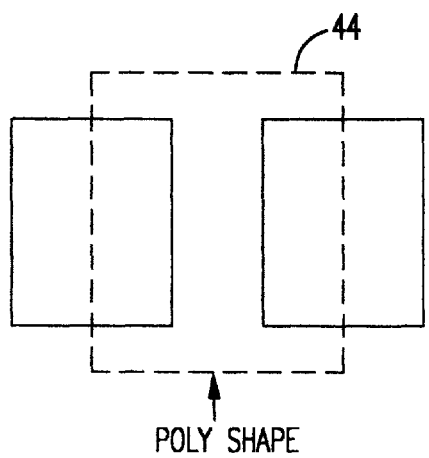
Figure 4C:
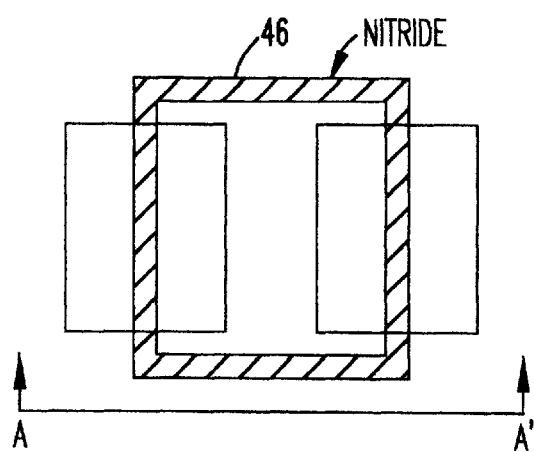
Figure 4D:
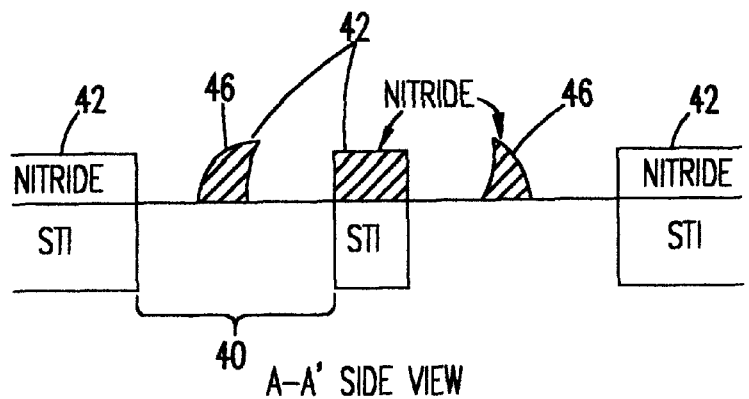
Figure 4E:
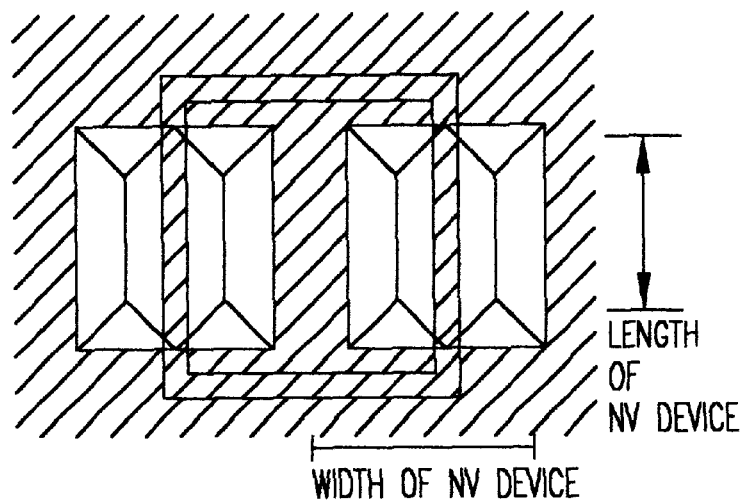
Figure 4F:
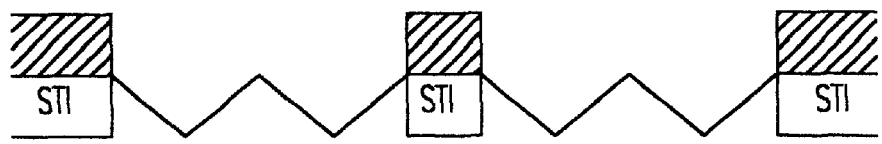

Referring now to FIGS. 4A–4F, an alternative technique for developing the edge structure in accordance with the invention for two adjacent memory cells will now be discussed. As shown in FIG. 4A, two gate area openings 40 in a nitride layer 42 are shown and isolation structures, impurity wells and crystal orientation are again assumed. As shown in FIG. 4B, a layer of polysilicon is deposited and lithographically patterned to form rectangular area 44 which should have a width slightly less than the distance between the center lines of the gate area openings 40 so that, as shown in FIGS. 4C and 4D, when a nitride sidewall spacer 46 is formed and the polysilicon removed, the nitride 46 will overlie the centerline of the gate area openings 40. Selective etching can then be performed as before, as shown in plan and cross-sectional views in FIGS. 4E and 4F, respectively.

In the above discussion of FIGS. 3A–3G and 4A–4F, the mask element 30, 46 which results in the upward directed edge of the edge structure can be formed at a width which is less than the minimum feature size which can be resolved with a particular lithography exposure tool, referred to as "sub-lithographic" dimensions.

However, it should be understood that the same process can be performed to produce mask features 30, 46 at any desired size. In other words, to produce the edge structure in accordance with the invention, two (or more) generally rectangular areas must be defined by a mask to obtain the desired shape of the edge structure by selective and preferential etching and the separation between these areas should be scaled to the overall dimensions of the transistor forming the memory cell. Therefore, it is not necessary to form mask element 30, 46 at sub-lithoqraphic dimensions unless the memory cell dimensions approach the minimum feature size or a small multiple thereof. However, sub-lithographic size of the mask element 30, 46 and undercutting during selective etching, alluded to above, are useful in developing a sharp upwardly directed edge to provide optimal field concentration in very small memory cells.

It is also possible to practice the invention to develop a memory cell of comparably small dimensions using a lithographically defined separation between generally rectangular areas to achieve the upward directed edge. Two exemplary lithographically defined mask shapes which can be used to practice the invention are shown in FIGS. 5 and 6. It will be recalled from the discussion of FIGS. 3A–3G that the etch process proceeds in strongly preferential directions in the monocrystalline silicon and that undercutting of mask element 30 was desirable and achieved to develop the upward direction edge.

In the mask of FIG. 5, mask element 50 is of a width 52 which is assumed to be of minimum feature size or greater. This element is angled in a central region in order to form two openings in the shape of a shallow "L" such that edges 54 and 56 of the mask are substantially collinear and located at the desired location of the upward directed edge of the edge structure. This formation favors undercutting of mask element 50 and is effective to form the upward directed edge of the edge structure in accordance with the invention.

A similar effect can be achieved with the mask shape of FIG. 6 in which mask element 60 (also assumed to have a width of at least minimum lithographic feature size) separates areas 62 at a slight angle. Ends 64, 66 of the edges of mask element 60 are arranged to define the ends of the upward directed edge of the edge structure in accordance with the invention. This location of the ends of the edges of mask element 60 also favors undercutting in the same manner as the mask shape of mask element 50 of FIG. 5. However, it is considered by the inventors that the mask shape of FIG. 6 may be more reliably formed at the current state of the art and is somewhat preferred for that reason.

Referring now to FIG. 7, a preferred layout for a pair of memory cells is shown. It should be understood that the layout of FIG. 7 would ordinarily be replicated many times as indicated by dots 70 along a common source line 72 and a pair of word lines 74 connecting and/or forming the control gate electrodes (e.g. 38 of FIG. 3E). Similarly, an arbitrary number of such rows of arbitrary length can be provided in a memory array on a chip. It should be noted that the source and drain diffusions 77, 76 may be implanted using the word lines as a mask and diffused slightly thereunder (e.g. to dashed lines 76', 77') by subsequent annealing. It should also be noted that the edge structure 10 extends into the drain diffusion 76 (16) sufficiently that the downward pointing tips 14 extend into the drain diffusion and to a lesser extent into source diffusion 77 (16') as also illustrated in cross-section in FIG. 2C. It may also be desirable to provide dimensions of both the source and drain such that the downward pointing tips 14 of the edge structure 10 are within the respective diffusion regions.

In view of the foregoing, it is seen that the invention provides significantly increased write and erase currents which supports substantial reductions of write and erase cycle times in a non-volatile memory. Reliability, manufacturing yield and number of write and erase cycles are significantly improved while manufacturing process windows are increased. Further, these benefits are achieved without imposing constraints on memory cell size or compromising operating margins.

While the invention has been described in terms of a single preferred embodiment, those skilled in the art will recognize that the invention can be practiced with modification within the spirit and scope of the appended claims.

I claim:

1. A non volatile memory cell comprising a semiconductor substrate having an edge structure including oppositely directed non-planar edges formed in a gate area of said memory cell, said edge structure providing enhancement of an electric field adjacent a floating gate, said floating gate being insulated from said substrate in said gate area;

a control gate located adjacent but insulated from said floating gate within said gate area; and source and drain diffusion regions wherein said edge structure extends into one of said source and drain regions.

2. A memory cell as recited in claim 1, wherein one of said oppositely directed edges is directed toward said semiconductor substrate and said edge directed toward said substrate extends into said one of said source and drain regions.

3. A memory cell as recited in claim 1, wherein said edge structure extends into both of said source and drain regions.

4. A memory cell as recited in claim 3, wherein one of said oppositely directed edges is directed toward said semiconductor substrate and said edge directed toward said substrate extends into said source and drain regions.

5. A memory cell as recited in claim 1 wherein a side of a said floating gate opposite said edge structure is substantially planar, and said control gate is substantially planar.

6. A memory cell as recited in claim 5 wherein a side of said floating gate structure adjacent said edge structure includes a plurality of angled surfaces joined at said oppositely directed edges.

7. A memory cell as recited in claim 6, wherein a side of said floating gate opposite said edge structure is substantially planar and said control gate is substantially planar.

* * * * *